(12) United States Patent
Kamo et al.

(10) Patent No.: US 11,874,437 B2
(45) Date of Patent: Jan. 16, 2024

(54) BLACK STRUCTURE AND SELF-LUMINOUS IMAGE DISPLAY DEVICE COMPRISING SAME

(71) Applicant: FUJIFILM Corporation, Tokyo (JP)

(72) Inventors: Makoto Kamo, Kanagawa (JP); Shuntaro Ibuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 805 days.

(21) Appl. No.: 17/007,396

(22) Filed: Aug. 31, 2020

(65) Prior Publication Data

US 2020/0400862 A1 Dec. 24, 2020

Related U.S. Application Data

(63) Continuation of application No. PCT/JP2019/012291, filed on Mar. 25, 2019.

(30) Foreign Application Priority Data

Mar. 28, 2018 (JP) .................................. 2018-063182
Mar. 13, 2019 (JP) .................................. 2019-046141

(51) Int. Cl.
*H10K 50/00* (2023.01)
*H10K 50/86* (2023.01)
(Continued)

(52) U.S. Cl.
CPC .............. *G02B 1/118* (2013.01); *G02B 5/003* (2013.01); *H01L 25/0753* (2013.01); *H10K 50/00* (2023.02); *H10K 50/865* (2023.02)

(58) Field of Classification Search
CPC ........ G02B 1/118; G02B 5/003; H10K 50/00; H10K 50/865; H05B 33/12
See application file for complete search history.

(56) References Cited

U.S. PATENT DOCUMENTS

2004/0253413 A1   12/2004   Baba et al.
2013/0182205 A1    7/2013   Hibayashi et al.
(Continued)

FOREIGN PATENT DOCUMENTS

CN   103140796 A   6/2013
CN   103972265 A   8/2014
(Continued)

OTHER PUBLICATIONS

Office Action, issued by the State Intellectual Property Office dated Nov. 3, 2021, in connection with Chinese Patent Application No. 201980021048.1.
(Continued)

*Primary Examiner* — Phat X Cao
(74) *Attorney, Agent, or Firm* — Edwards Neils LLC; Jean C. Edwards, Esq.

(57) ABSTRACT

A black structure includes a black layer and a light transmitting portion in a same plane, in which the black layer has a fine uneven structure having a period of 380 nm or less on a surface of the black layer on the viewing side, and a surface of the black layer opposite to the surface having the fine uneven structure is bonded to a base material. A self-luminous image display device includes a self-luminous image display panel and the black structure.

5 Claims, 5 Drawing Sheets

(51) Int. Cl.
  *G02B 1/118* (2015.01)
  *H01L 25/075* (2006.01)
  *G02B 5/00* (2006.01)

(56) References Cited

U.S. PATENT DOCUMENTS

| | | | |
|---|---|---|---|
| 2014/0217431 A1 | | 8/2014 | Aoyagi et al. |
| 2015/0177420 A1 | * | 6/2015 | Fujii .................. G02B 1/04 359/601 |
| 2017/0084669 A1 | | 3/2017 | Wolk et al. |
| 2019/0162878 A1 | | 5/2019 | Fukushima et al. |

FOREIGN PATENT DOCUMENTS

| | | | |
|---|---|---|---|
| JP | 06-347778 A | | 12/1994 |
| JP | 2004-258586 A | | 9/2004 |
| JP | 2010-286615 A | | 12/2010 |
| JP | 2010286615 A | * | 12/2010 |
| JP | 2011-013387 A | | 1/2011 |
| JP | 2016-061794 A | | 4/2016 |
| JP | 2017-508258 A | | 3/2017 |
| WO | 2018/025818 A1 | | 2/2018 |
| WO | WO-2018025818 A1 | * | 2/2018 ............ B32B 17/06 |

OTHER PUBLICATIONS

Office Action, issued by the Japanese Patent Office dated Apr. 6, 2021, in connection with corresponding Japanese Patent Application No. 2020-510006.
International Search Report Issued in PCT/JP2019/012291 dated Jun. 11, 2019.
Written Opinion Issued in PCT/JP2019/012291 dated Jun. 11, 2019.
International Preliminary Report on Patentability Issued in PCT/JP2019/012291 dated Sep. 29, 2020.
Office Action, issued by the Korean Intellectual Property Office dated Feb. 22, 2022, in connection with Korean Patent Application No. 10-2020-7026475.

* cited by examiner

BLACK STRUCTURE AND SELF-LUMINOUS IMAGE DISPLAY DEVICE COMPRISING SAME

CROSS-REFERENCE TO RELATED APPLICATIONS

This application is a Continuation of PCT International Application No. PCT/JP2019/012291 filed on Mar. 25, 2019, which was published under PCT Article 21(2) in Japanese, and which claims priority under 35 U.S.C § 119(a) to Japanese Patent Application No. 2018-063182 filed on Mar. 28, 2018, and Japanese Patent Application No. 2019-046141 filed on Mar. 13, 2019. The above applications are hereby expressly incorporated by reference, in their entirety, into the present application.

BACKGROUND OF THE INVENTION

1. Field of the Invention

The present invention relates to a black structure and a self-luminous image display device comprising the same.

2. Description of the Related Art

In the related art, in a liquid crystal display device, full color display is performed by providing a color filter in a liquid crystal cell. Further, the color filter plays a role of suppressing color mixture and light leakage between pixels by providing a black layer (also referred to as a black matrix) that separates pixels therein and a role of concealing a non-display region such as a thin film transistor (TFT) element or wiring so that the region is not seen by an observer (see JP1994-347778A (JP-H06-347778A)).

Typically, a color filter and a black layer are formed on a substrate (mainly a glass substrate) that constitutes liquid crystal cells, and the presence of a polarizing plate and a surface film on an observer side of the substrate is considered as a main factor of a decrease in display contrast due to the surface reflection. In addition, the proportion of the black layer in the entire display region is small. Therefore, the reflection on a viewing-side interface of the black layer has not been considered to be important.

SUMMARY OF THE INVENTION

However, in recent years, with the spread of self-luminous image display devices, the black layer is being taken up again. In a self-luminous image display device, pixels flicker in full color and a color filter is not necessary in principle, but a drive circuit still exists on a panel, and these reflect light from the outside and thus the display contrast is decreased. In an organic EL display device, a circularly polarizing plate is provided on a viewing side to prevent light from the outside from being reflected on an electrode or the like on a panel, but there is a drawback that the display brightness is also decreased at the same time.

Therefore, as a result of examination on a black structure obtained by providing a black layer on a surface of a panel to cover a non-light emitting region so as to improve the display contrast, it was found that the black structure with an excellent brightness is obtained, but known black matrix materials of the related art still have room for improvement in terms of surface reflectivity of the black layer.

Accordingly, an object of the present invention is to provide a black structure having a reduced surface reflectivity, and a self-luminous display device comprising the black structure.

As a reason why desired characteristics cannot be obtained with known black matrix materials of the related art, the present inventors considered that satisfactory characteristics cannot be obtained simply by providing the materials on the front surface of the self-luminous image display panel because the refractive index distribution, the light absorption characteristics, and the materials are designed, assuming that the materials of the related art are used mainly in contact with glass on a viewing side. Further, there is a problem in that the tint tends to change in an oblique visual field direction in a case of using a method of providing a dielectric multilayer film on the surface to reduce the reflection and the reflectivity cannot be sufficiently reduced in a case of using a method of separately providing a layer of a low refractive index.

Here, as a result of intensive examination conducted by the present inventors, it was found that the above-described problem can be solved by providing a fine uneven structure on the surface of the black structure.

That is, it was found that the above-described object can be achieved by employing the following configurations.

[1] A black structure comprising, in a same plane: a black layer which absorbs light beams from a viewing side; and a light transmitting portion which transmits light incident from a side opposite to the viewing side, in which the black layer has a fine uneven structure having a period of 380 nm or less on a surface of the black layer on the viewing side, and a surface of the black layer opposite to the surface having the fine uneven structure is bonded to a base material.

[2] The black structure according to [1], in which the light transmitting portion is filled with a transparent material.

[3] The black structure according to [2], in which the surface of the black layer on the viewing side and a surface of the light transmitting portion on the viewing side which is filled with the transparent material are provided on the same plane, and a fine uneven structure which is the same as the fine uneven structure provided on the black layer is also provided on the surface of the light transmitting portion on the viewing side.

[4] The black structure according to any one of [1] to [3], in which the fine uneven structure is constituted of a moth-eye structure consisting of fine particles having an average primary particle diameter of 100 to 250 nm which are buried in a binder resin layer.

[5] A self-luminous image display device comprising: a self-luminous image display panel; and a black structure which includes a black layer and a light transmitting portion in a same plane, in which the black layer has a fine uneven structure provided on a surface of the black layer on a viewing side and a surface of the black layer opposite to the surface having the fine uneven structure faces an image display panel, and the light transmitting portion is provided above a light emitting element of the self-luminous image display panel.

[6] The self-luminous image display device according to [5], in which a surface of the self-luminous image display panel is covered with a continuous transparent layer, and the black structure is provided on a surface of the transparent layer on the viewing side.

[7] The self-luminous image display device according to [6], in which the light transmitting portion of the black structure is filled with a transparent material.

[8] The self-luminous image display device according to [7], in which the transparent layer and the light transmitting portion filled with the transparent material are integrally formed with each other.

[9] The self-luminous image display device according to [8], in which the surface of the black layer on the viewing side and a surface of the light transmitting portion on the viewing side are provided on the same plane, and a fine uneven structure which is the same as the fine uneven structure provided on the black layer and having a period of 380 nm or less is also provided on the surface of the light transmitting portion on the viewing side.

[10] The self-luminous image display device according to any one of [5] to [9], in which the fine uneven structure is constituted of a moth-eye structure consisting of fine particles having an average primary particle diameter of 100 to 250 nm which are buried in a binder resin layer.

According to the present invention, it is possible to provide a black structure having a reduced surface reflectivity, and a self-luminous display device comprising the black structure, which has a low surface reflectivity, high jet blackness during non-display, and excellent display contrast.

DESCRIPTION OF THE PREFERRED EMBODIMENTS

Hereinafter, the present invention will be described in detail.

The description of the constituent requirements below may be made based on representative embodiments of the present invention, but the present invention is not limited to such embodiments.

Further, in the present specification, the numerical ranges shown using "to" indicate ranges including the numerical values described before and after "to" as the lower limits and the upper limits.

[Black Structure]

Figure 1:
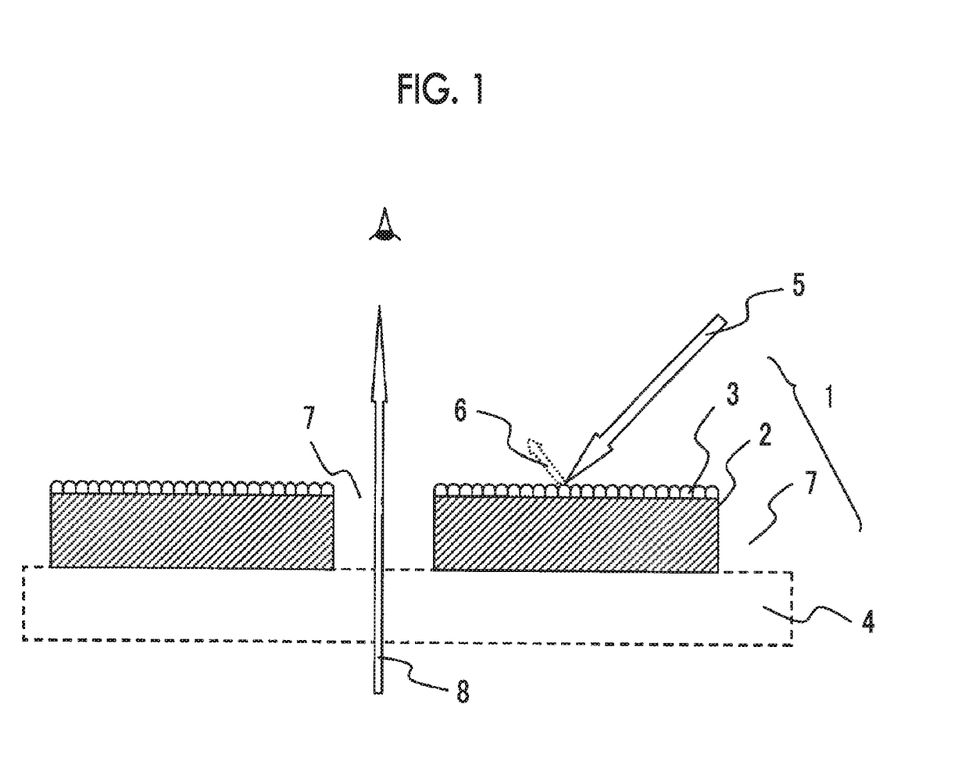
FIG. 1 is a conceptual view illustrating the states of a black structure of the present invention, light from a viewing side, and display light.

A black structure according to the embodiment of the present invention is a black structure including, in a same plane, a black layer which absorbs light beams from a viewing side, and a light transmitting portion which transmits light incident from a side opposite to the viewing side, in which the black layer has a fine uneven structure having a period of 380 nm or less on a surface of the black layer on the viewing side. As illustrated in FIG. 1, a black layer 2 of a black structure 1 can be in contact with an optional base material 4 directly or through another layer such as an adhesive layer on a side where a fine uneven structure 3 is not provided. The black layer 2 has a role of absorbing light 5 incident from the viewing side, and the fine uneven structure 3 reduces reflection 6 on the surface of the black layer 2 on the viewing side. A light transmitting portion 7 transmits light 8 emitted from a light source provided on a side opposite to the viewing side.

As a result of various examinations conducted by the present inventors in order to realize a black structure that has low surface reflection and efficiently absorbs incident light from the viewing side, it was found that the black structure exhibits high jet blackness in a case where a structure that reduces the reflectivity using a fine uneven structure is employed, thereby completing the present invention.

Typically, the structure that reduces the reflectivity can be obtained by a method of using interference (such as a method of providing a dielectric multilayer film or a method of providing a layer of a low refractive index with a controlled film thickness) or a method of using modulation of the refractive index (such as a method of using a structure finer than the visible light wavelength), and the inventors consider that the method of using modulation of the refractive index is advantageous in terms that the reflection characteristics are uniform in a wide band and viewing angle dependency is not shown. Further, according to the method described in the present invention, sufficient modulation of the refractive index can be provided with excellent reproducibility even in a case of thin modulation. It is considered that since almost all light that once enters a black layer is extinguished while absorption, scattering, refraction, and reflection are repeated inside, an excellent black color (jet blackness) can be exhibited.

Hereinafter, the black layer constituting the black structure and the fine uneven structure will be described in detail with reference to examples of materials and forming methods.

[Black Layer]

As the black layer constituting the black structure according to the embodiment of the present invention, a known black material can be used without limitation. The optical density (OD) value of the black layer is preferably 1.5/μm or greater and more preferably 3.0/μm or greater. As such a black material, for example, a metal material film such as chromium, nickel, or aluminum each having a surface that is blackened, or a black resin layer can be used. It is preferable to use a black resin layer from the viewpoint of exhibiting a more neutral black color visually. The black resin layer can be formed of a black composition. Hereinafter, the black composition will be described below.

<Black Composition>

The black composition which can be used in the present invention is not particularly limited, but may include, for example, a black pigment and a binder precursor. Further, the black composition may contain other component as necessary. The black composition may be photosensitive or non-photosensitive. The method of forming the black composition is not particularly limited, but the black composition can be formed by a printing method, an ink jet method, a photolithography method, a transfer method, or a method of combining any of these methods with heating or exposure depending on the characteristics of the black composition to be used.

The black pigment is not particularly limited, but a carbon-based black pigment such as carbon black or an organic black pigment is suitably used. Further, a pigment exhibiting a black color among carbon nanomaterials such as carbon nanotubes and graphite can also be used. These black pigments can be subjected to various surface treatments in order to improve the dispersibility in a binder and control the electronic state of the surface to adjust the tint.

In addition to the black pigment, various auxiliary pigments can be added for the purpose of enhancing the light shielding properties of the black layer or correcting the tint. Examples of the auxiliary pigments include black organic pigments such as perylene black and aniline black; mixed-color organic pigments such as pigments that are pseudo-blackened by mixing at least two kinds of pigments selected from red, blue, green, violet, yellow, magenta, and cyan pigments; inorganic pigments such as graphite and metal fine particles such as titanium, copper, iron, manganese, cobalt, chromium, nickel, zinc, calcium, and silver; metal oxides, complex oxides, metal sulfides, and metal nitrides. The black layer obtained from the black composition may be accompanied by a change in the reflection tint in an oblique direction referred to as a "bronze phenomenon" depending on the concentration or dispersion state of the pigment to be added, and a black layer having excellent jet blackness at any angle can be realized by appropriately selecting these auxiliary pigments.

Various organic polymer materials, polymerizable monomers, or combinations of crosslinking agents can be used as the binder precursor, but it is preferable to use a photosensitive binder precursor from the viewpoint that the edge of the pattern can be precisely controlled. The photosensitive binder precursor may be of a positive type or a negative type. An unexposed portion can be removed by employing various etching processes, and etching carried out using an alkali developing solution can be used in terms of excellent versatility.

In a case where a photosensitive binder precursor having alkali developability is used as the photosensitive binder precursor, etching can be performed by alkali development. As an example of the photosensitive binder precursor having alkali developability, a combination of an alkali-soluble resin, a polymerizable monomer, and a polymerization initiator can be used.

The alkali-soluble resin is not particularly limited, and examples thereof include typical photopolymerizable resins such as a bisphenol A type epoxy resin, a bisphenol F type epoxy resin, a novolak type epoxy resin, polycarboxylic acid glycidyl ester, polyol polyglycidyl ester, an aliphatic or alicyclic epoxy resin, an amine epoxy resin, a triphenol methane type epoxy resin, a (meth)acrylic resin containing a polar group such as an acidic group such as a carboxyl group or a salt thereof in a side chain, and epoxy (meth) acrylate obtained by reacting (meth)acrylic acid with an epoxy resin such as a dihydroxybenzene type epoxy resin, and a cardo resin.

The polymerizable monomer is not particularly limited, and an epoxy compound, a (meth)acrylate compound, or the like can be used as the polymerizable monomer. As a preferred embodiment, a compound having ethylenically unsaturated double bonds with a molecular weight of 300 to 1700 can be used. In the compound having ethylenically unsaturated bonds, the number of ethylenically unsaturated double bonds in one molecule of the compound is preferably in a range of 2 to 6. In a case where such a compound is used, a black layer which has excellent film hardness, a light transmitting portion with a low film residual rate described later, and an excellent edge shape can be formed.

Various known polymerization initiators can be used as the polymerization initiator, and examples thereof include an oxime ester-based compound, an acetophenone-based compound, a triazine-based compound, a benzophenone-based compound, a thioxanthone-based compound, an imidazole-based compound, a titanocene-based compound, and an acylphosphine compound. Among the oxime ester-based compound, the titanocene-based compound, and the acetophenone-based compound, it is preferable to use an amino-acetophenone-based compound from the viewpoint of excellent curability even in a case of a film with a high optical density (OD) of the black layer.

A pigment dispersion stabilizer, a surfactant, an antifoaming agent, a dye, an antioxidant, a polymerization inhibitor, a sensitizer, a tackifier, an adhesion improver, a brittleness improver, or the like as necessary can be further added to the black composition.

<Method of Forming Black Layer>

As described above, various forming methods can be used in a case of forming the black layer and the light transmitting portion. Further, the black layer can be provided on a surface of an image display device or any surface of various films to be incorporated in the image display device. At that time, the black layer may be provided directly on any of these surfaces or the black layer may be provided on a temporary support for formation and then transferred to a surface of the device or any surface of various films. Hereinafter, the details will be described with reference to the accompanying drawings.

Figure 2A:
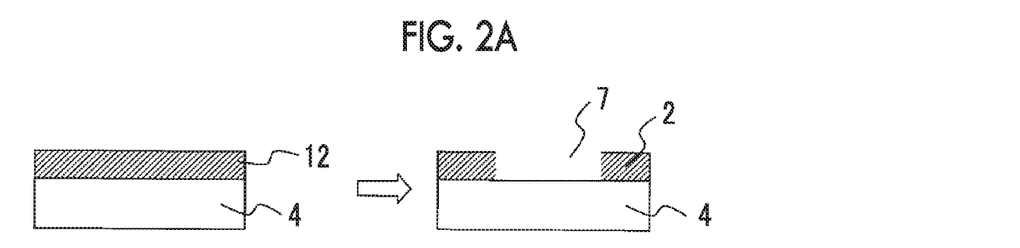
FIGS. 2A to 2C are conceptual views illustrating a method of forming a black layer in the present invention.

According to a first embodiment, as illustrated in FIG. 2A, a coated film 12 of the black composition is provided on the surface of the image display device as the base material 4 or any surface of various films to be incorporated in the image display device, and patterning or etching is appropriately performed to provide the light transmitting portion 7. Further, curing or baking is performed as necessary to form the black layer 2 on the surface of the image display device or any surface of various films to be incorporated in the image display device.

Figure 2B:
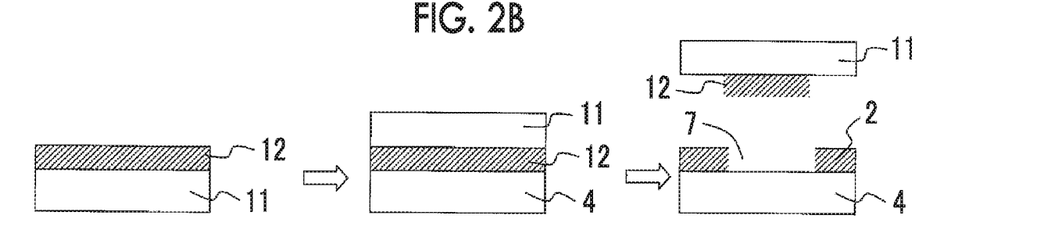

According to a second embodiment, as illustrated in FIG. 2B, the coated film 12 of the black composition is provided on a temporary support 11 for formation, the surface of the coated film is bonded to the surface of the image display device as the base material 4 or any surface of various films to be incorporated in the image display device directly with the temporary support 11 for formation or through an adhesive layer (not illustrated), patterning is appropriately performed, the coated film 12 of a portion corresponding to the light transmitting portion is removed to form the light transmitting portion 7, and the temporary support 11 for formation is peeled off and removed to form the black layer 2 on the surface of the image display device or any surface of various films to be incorporated in the image display device. In FIG. 2B, the drawing is made such that the coated film 12 of the portion corresponding to the light transmitting portion is removed together with the temporary support 11 for formation, but it is not necessary to remove both the coated film and the temporary support together. For example, after the temporary support for formation is peeled off and removed, the coated film 12 of the portion corresponding to the light transmitting portion may be sequentially removed.

Figure 2C:
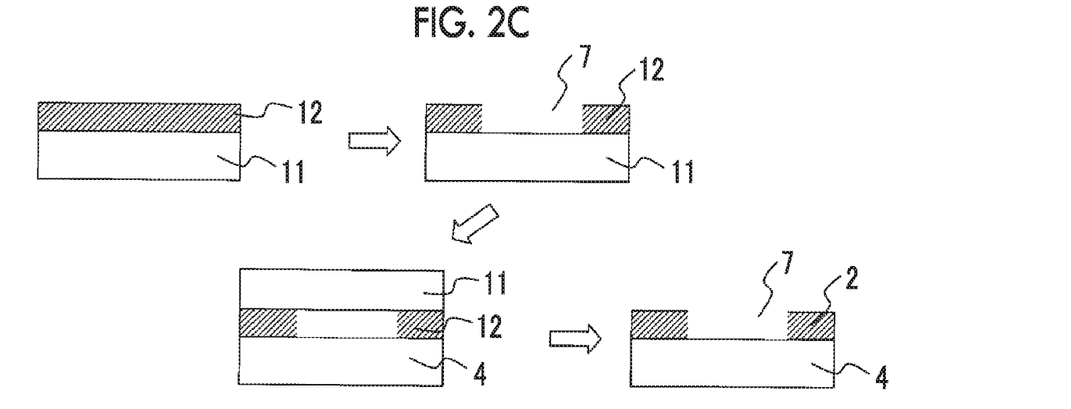

According to a third embodiment, as illustrated in FIG. 2C, a coated film of the black composition is provided on a temporary support for formation, etching and patterning are performed on the temporary support for formation to form the light transmitting portion 7, the black structure is transferred to the surface of the image display device as the base material 4 or any surface of various films to be incorporated in the image display device using the adhesiveness of an adhesive layer (not illustrated) or the adhesiveness of the black layer, and the temporary support 11 for formation is peeled off and removed to form the black layer 2 on the surface of the image display device or any surface of various films to be incorporated in the image display device.

As the temporary support for formation which is used for these forming methods, known plastic films, glass, and the like can be used without limitation. Examples of the plastic film include a polyester film such as a polyethylene terephthalate film or a polyethylene naphthalate film, a cellulose-based film such as a triacetyl cellulose film, an acrylic resin film, a polyolefin film such as a polyethylene film or a polypropylene film, and a polycycloolefin film.

[Fine Uneven Structure]

The fine uneven structure provided on the black layer (the surface on the viewing side) of the black structure according to the embodiment of the present invention indicates an uneven structure having a period of the visible light wavelength or less, that is, 380 nm or less. In a case where the period of the unevenness is in the above-described range, the effect of light diffusion is reduced and thus clear transmission characteristics without haze can be exhibited. Further, from the viewpoint of excellent antireflection properties in a visible light range, it is preferable that the period is 100 nm or greater. The presence or absence of the fine uneven structure can be confirmed by observing the surface shape with a scanning electron microscope (SEM), an atomic force microscope (AFM), or the like and investigating whether the fine uneven structure has been formed. Such a fine uneven structure includes a so-called moth-eye structure.

Various methods can be employed as a method of forming the fine uneven structure, and examples thereof include a method of pressing a mold having fine unevenness on a surface of the black layer for shaping and a method of utilizing phase separation or self-organization occurring in the process of evaporation of a solvent from a mixed solution of a polymer constituting the black layer.

Further, according to a preferred embodiment, a fine uneven structure can be formed on the surface of the black layer by transferring a separately produced fine uneven structure film to the surface of the black layer so as to be integrated. According to this method, there is an advantage that a fine uneven structure having an excellent antireflection function can be formed while the degree of freedom in selecting the material of the black composition is high. Hereinafter, specific examples thereof will be described.

Example of Forming Fine Uneven Structure

Figure 3:
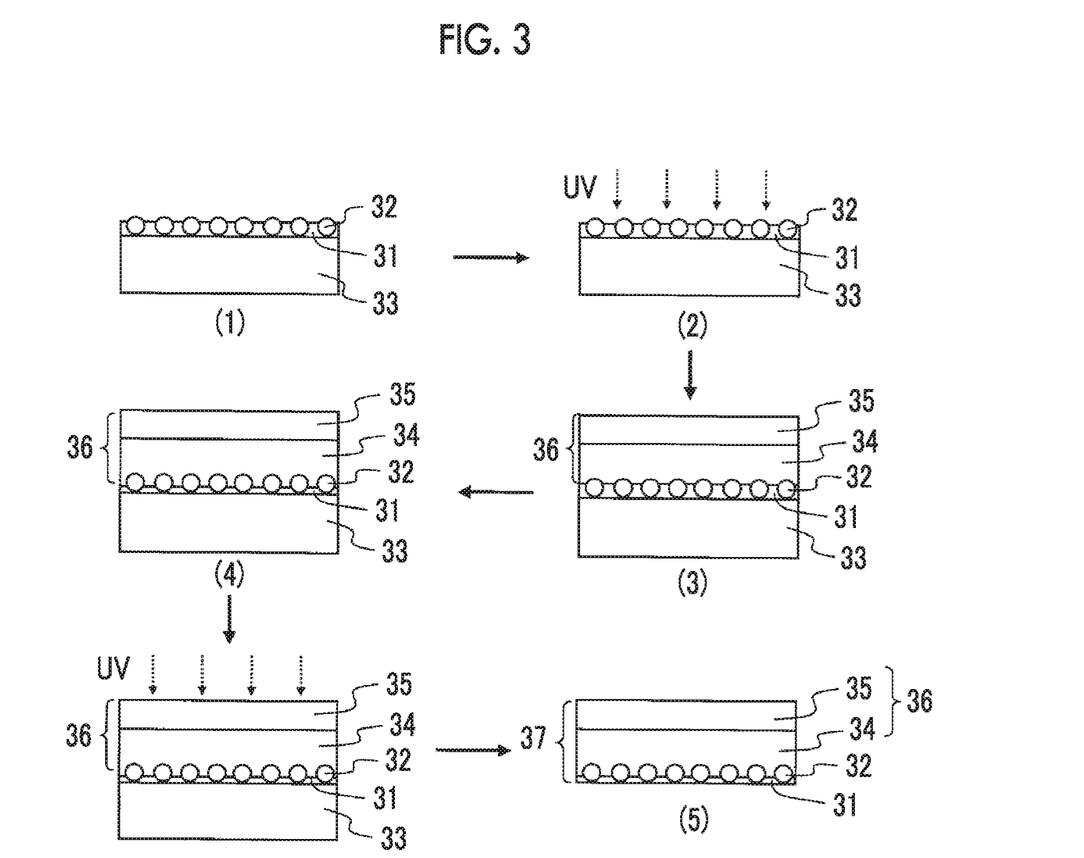
FIG. 3 is a conceptual view illustrating an example of a method of forming a fine uneven structure that can be used in the present invention.
Figure 4:
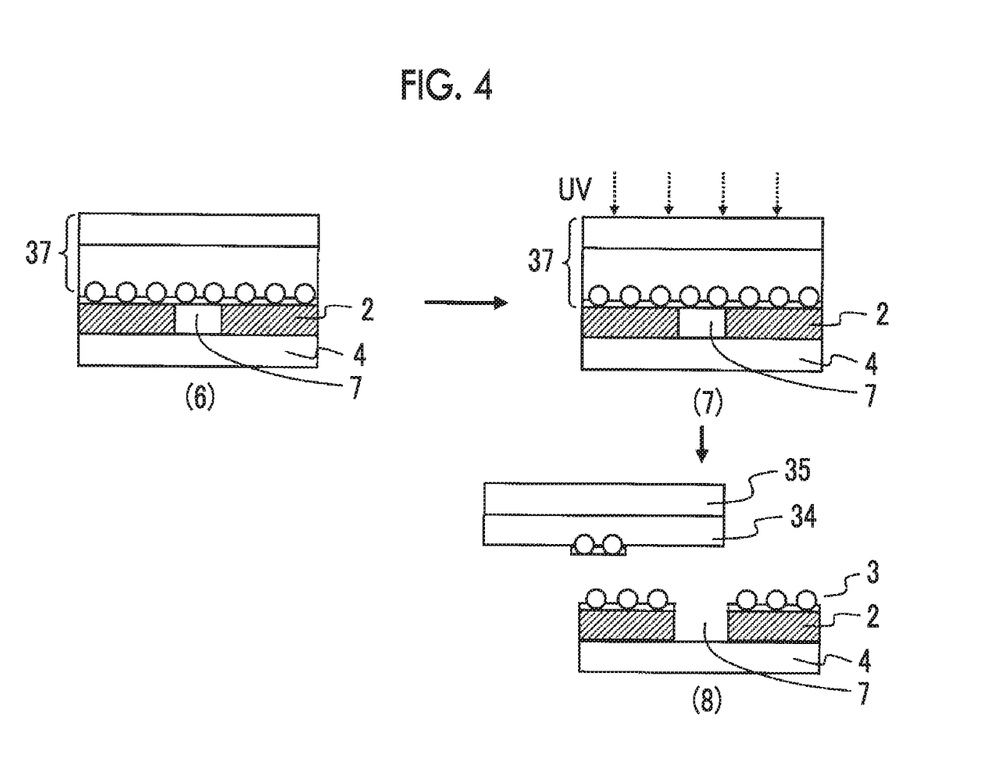
FIG. 4 is a conceptual view illustrating an example of the method of forming a fine uneven structure that can be used in the present invention.

In the present invention, for example, a fine uneven structure can be provided on the surface of the black layer on the viewing side by performing the following steps (1) to (8). The conceptual views are illustrated in FIGS. 3 and 4.

A fine uneven structure can be provided on the surface of the black layer on the viewing side by sequentially performing a step (1) of providing particles (a2) having an average primary particle diameter of 100 nm to 250 nm and a curable compound (a1) on a temporary support with a thickness at which the particles (a2) are buried in a layer (a) containing the curable compound (a1);

a step (2) of curing a part of the layer (a) to obtain a layer (ca);

a step (3) of attaching a layer (b) of a pressure sensitive adhesive film that includes a support and the layer (b) containing a pressure sensitive adhesive on the support, to the layer (ca);

a step (4) of allowing the position of the interface of the layer (ca) on the support side to approach to the temporary support side so that the particles (a2) are buried in the layer obtained by combining the layer (ca) with the layer (b) and protrude from the interface of the layer (ca) on the support side;

a step (5) of peeling off the temporary support;

a step (6) of attaching the black layer provided on an optional base material and the layer (ca) of the laminate including the layer (ca) obtained in the step (5) to each other;

a step (7) of curing the layer (ca) in a state where the particles (a2) are buried in the layer obtained by combining the layer (ca) with the layer (b); and a step (8) of peeling off the pressure sensitive adhesive film.

Here, the expression the "thickness of the particles (a2) buried in the layer (a)" means that the thickness of the layer (a) is 0.8 times or greater the average primary particle diameter of the particles (a2).

Further, in the present invention, the expression "the particles (a2) are buried in the layer obtained by combining the layer (ca) with the layer (b)" means that the thickness of the layer obtained by combining the layer (ca) with the layer (b) is 0.8 times or greater the average primary particle diameter of the particles (a2).

In the step (1), the method of providing the layer (a) on the temporary support is not particularly limited, and a known method can be used. The coating method is not particularly limited, and a known method can be used. Examples thereof include a dip coating method, an air knife coating method, a curtain coating method, a roller coating method, a wire bar coating method, a gravure coating method, and a die coating method.

The composition for forming the layer (a) may contain a curable compound (a1) and particles (a2) having an average primary particle diameter of 100 nm to 250 nm and may further contain a solvent, a dispersion stabilizer of the particles (a2), a polymer, a surfactant, and other components as necessary. The reactant of the curable compound (a1), the polymer, and the like constitute the binder resin by performing the process described below.

As the curable compound (a1), a compound containing a polymerizable functional group (preferably an ionizing radiation curable compound) is preferable. As the compound containing a polymerizable functional group, various monomers, oligomers, or polymers can be used. Further, as the polymerizable functional group (polymerizable group), a photopolymerizable group, a thermopolymerizable group, an electron beam polymerizable group, or a radiation polymerizable group is preferable. Among these, a photopolymerizable functional group is preferable. Specifically, an acrylate compound and particularly a polyfunctional acrylate compound can be used. It is preferable to further add a compound that initiates or accelerates these polymerizations.

As the particles (a2), various materials can be used as long as the particles have an average primary particle diameter of 100 nm to 250 nm. From the viewpoints of availability and monodispersity, preferred examples thereof include metal oxide fine particles such as silica, alumina, titania, and zirconia; and resin fine particles such as an acrylic resin and a urethane resin. Particularly in a case where metal oxide fine particles are used, it is preferable to add a silane coupling agent, polyvinyl alcohol, or the like as a dispersion stabilizer.

As the polymer, various known polymer materials can be added for the purpose of improving the strength and brittleness of the layer (a) and suppressing aggregation of each component. As the surfactant, anionic, nonionic, and cationic surfactants can be used without limitation.

In the step (2), a part of the curable compound (a1) contained in the composition for forming the layer (a) is cured. As a curing method, a known method can be used depending on the curable compound. In a case of a photocurable compound, the compound can be cured by applying predetermined exposure energy to a coated film of the composition for forming the layer (a) using a UV lamp, a UV-LED, electron beams, or the like as a light source.

Here, curing of a part of the curable compound (a1) indicates that only a part of the curable compound (a1) is cured without curing the entire curable compound (a1). In the subsequent steps, the remaining curable compound (a1) is transferred or removed to another layer, whereby the layer (a) can form a fine uneven structure.

The layer (b) containing the pressure sensitive adhesive used in the step (3) may be a layer containing the pressure sensitive adhesive and various components, and various known pressure sensitive adhesive polymers can be used as the pressure sensitive adhesive. It is preferable that the pressure sensitive adhesive contained in the layer (b) has a gel fraction of 95% or greater from the viewpoint that adhesive residues are not generated in the subsequent steps.

Examples of such pressure sensitive adhesive polymers include an acrylic polymer, a styrene-based polymer, a butadiene-based polymer, an isoprene-based polymer, a polyester-based polymer, a polyolefin-based polymer, a polysiloxane-based polymer, and random copolymers thereof and block copolymers thereof. Among these, an acrylic polymer is particularly preferable.

The pressure sensitive adhesive layer may contain a tackifier, an antioxidant, a plasticizer, an antistatic agent, and the like as necessary. For the purpose of facilitating the peeling of the layer (ca) and the layer (b) in the step (5), it is preferable to add an easily release agent such as a fluorine compound or a silicone compound to the layer (b).

As the support that supports the layer (b) containing a pressure sensitive adhesive in the step (3), various known supports can be used without limitation. Typically, examples thereof include polyethylene terephthalate, cellulose acylate, and polypropylene.

The step (4) can be performed by allowing layer (b) to absorb the curable compound (a) remaining in layer (ca). The absorption may be performed by natural diffusion of the curable compound (a), but may be accelerated by a method such as pressurization or heating.

The film including the layer (ca) obtained in the above-described manner and the layer (b) containing a pressure sensitive adhesive is attached to a black layer separately provided on an optional base material (for example, an image display panel or a functional film) in the step (5). The black layer here may be a layer that has already been patterned and provided with a light transmitting portion.

Further, the black layer is integrated with the layer (ca) by further performing the step (7), and a fine uneven structure is formed on the surface of the black layer. At this time, in a case where the light transmitting portion is a void, since the layer (ca) is easily broken at the boundary between the black layer and the light transmitting portion, the layer (ca) (strictly speaking, a structure derived from the layer (ca)) remains on the black layer, and the layer (ca) remains on the layer (b) in the light transmitting portion, a fine uneven structure is formed only on the black layer. As described later, in a case where the light transmitting portion is filled with a transparent material and the surface of the light transmitting portion on the viewing side is flush with the surface of the black layer on the viewing side, a fine uneven structure can be provided on the surface of the light transmitting portion on the viewing side.

Further, according to another preferred embodiment, the laminate obtained by sequentially laminating the obtained black layer, the layer (ca), and the pressure sensitive adhesive film including the layer (b) containing a pressure sensitive adhesive can be transferred by attaching the surface of the laminate on the black layer side to the surface of the image display device or any surface of various films incorporated in the image display device by performing the same procedures (2) to (5) described above except that the black layer is provided between the layer (a) and the temporary support.

In the present invention, it is preferable that the fine uneven structure is constituted of a moth-eye structure formed of fine particles having an average primary particle diameter of 100 to 250 nm which are buried in the binder resin layer.

In the black structure according to the embodiment of the present invention, since the reflectivity may change depending on the wavelength due to the interference effect or diffraction of light in the fine uneven structure, it is preferable that the reflection spectrum is flat over the visible light range in order to realize a black tint closer to a neutral tint. More specifically, in the black structure, a difference $\Delta R$ between the maximum value and the minimum value of the reflectivity of the front surface in a wavelength range of 380 inn to 780 nm is preferably 0.5% or less, more preferably 0.3% or less, and more preferably less than 0.1%.

[Light Transmitting Portion]

The black structure according to the embodiment of the present invention has a light transmitting portion that transmits light incident from a side opposite to the viewing side of the black structure. The light transmitting portion can have various shapes depending on the applications. Based on the purpose of providing the black structure according to the embodiment of the present invention, it is desirable that the light transmitting portion is provided at a position and in a shape corresponding to the pixel portion of the image display device.

By appropriately designing the shape and area ratio of the light transmitting portion with respect to the pixel size (occupied area in the normal direction), it is possible to improve the efficiency of extracting light from the image display panel, improve or control viewing angle characteristics, and reduce the crosstalk between pixels. Further, these can also be improved and controlled by controlling the shape of the boundary between the light transmitting portion and the black layer.

Figure 5A:
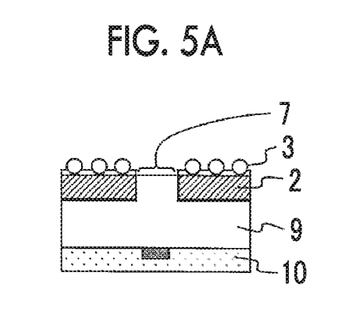
FIGS. 5A to 5C are cross-sectional views illustrating a form in which a light transmitting portion is filled with a transparent material or a transparent resin layer.
Figure 5B:
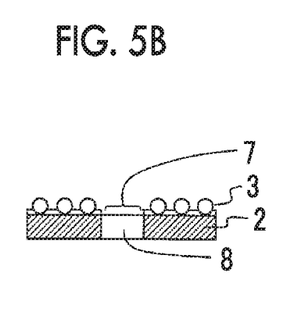

The light transmitting portion may be a void, but may be filled with a transparent resin as necessary. In particular, in a case where the black layer 2 and the black structure 1 are formed by being buried in a transparent resin layer 9 that seals the image display panel 10 as illustrated in FIG. 5A, the light transmitting portion 7 may be occupied by such a transparent resin layer 9. In a case of FIG. 5A or in a case where the light transmitting portion 7 is filled with the transparent material 8 as illustrated in FIG. 5B, a known transparent material such as glass or a transparent resin can be used. Examples of the transparent resin include an acrylic resin, an epoxy resin, a polyolefin resin, a polycarbonate resin, a polyester resin, and a polyimide resin. As the transparent resin, it is preferable to use a resin having a total light transmittance of 80% or greater in a case of a film having a thickness of a 40 μm.

Figure 5C:
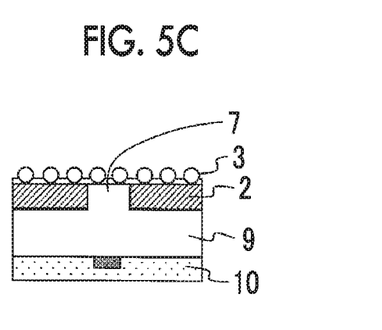
Figure 6:
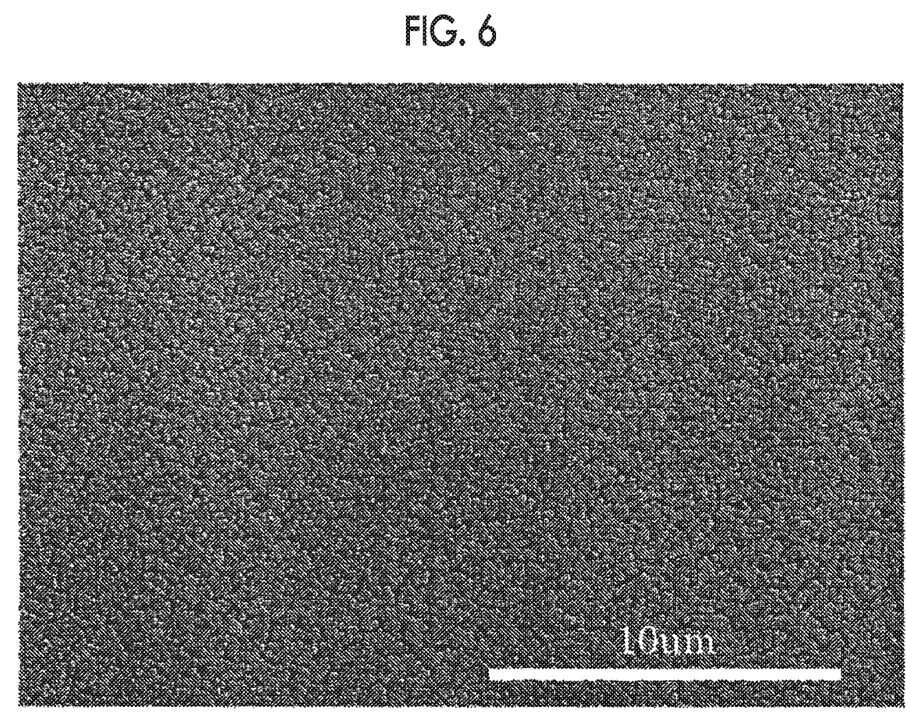
FIG. 6 shows an example of a fine uneven structure α actually formed on the black layer, which is imaged by an electron microscope from a viewing side.

In a case where the light transmitting portion is filled with a transparent material, as illustrated in FIG. 5A, it is preferable that the surface of the light transmitting portion on the viewing side which is filled with a transparent resin is flush with the surface of the black layer on the viewing side. In this manner, since the surface of the black structure on the viewing side is a flat surface, reflected light or refracted light due to unevenness is unlikely to occur, and the display image quality can be further improved. Further, in a case where the surface of the light transmitting portion on the viewing side which is filled with a transparent resin is flush with the surface of the black layer on the viewing side, as illustrated in FIG. 5C, the fine uneven structure can be provided on the entire surface of the black structure on the viewing side by providing the fine uneven structure 3 described above not only on the surface of the black layer 2 on the viewing side but also on the surface of the light transmitting portion 7 on the viewing side which is filled with a transparent resin. In this manner, the transmittance of light transmitted through the light transmitting portion is increased, and the brightness of the display device can also be further improved.

In the present invention, it is preferable that the light transmitting portion is filled with a transparent material.

Further, in the present invention, it is preferable that the surface of the black layer on the viewing side is flush with the surface of the light transmitting portion on the viewing side which is filled with the transparent material and the same fine uneven structure as the fine uneven structure provided on the black layer is also provided on the surface of the light transmitting portion on the viewing side.

The area ratio of the black layer to the light transmitting portion in the plan view area of the black structure varies depending on the pixel size and the pixel density of the display panel to be applied, but in consideration of the balance between the viewing angle, the brightness, the contrast ratio, and the like, the area ratio of the black layer to the light transmitting portion is preferably in a range of 50:50 to 9.5:5.

[Self-Luminous Image Display Device]

A self-luminous image display device according to the embodiment of the present invention is a self-luminous image display device including a self-luminous image display panel; and a black structure which includes a black layer and a light transmitting portion in a same plane, in which the black layer has a fine uneven structure provided on a surface on a viewing side and a surface of the black layer opposite to the surface having the fine uneven structure faces an image display panel, and the light transmitting portion is provided above a light emitting element of the self-luminous image display panel.

The self-luminous image display device according to the embodiment of the present invention includes the above-described black structure according to the embodiment of the present invention on the surface of the image display panel. That is, the black structure formed by sequentially laminating the fine uneven structure layer and the black layer from the viewing side is provided on the image display panel. It is preferable that the black structure covers the non-light emitting region of the image display panel and includes a light transmitting portion on the light emitting region. The shape of the light transmitting portion and the area ratio of the black layer to the light transmitting portion are as described above. Further, the area ratio of the light transmitting portion to the light emitting region (light transmitting portion: light emitting region) depends on the distance from the light emitting element to the surface on which the black structure is provided and the size of the light emitting element, but the area ratio thereof is preferably in a range of 1:1.5 to 1:4 from the viewpoint of the balance between the viewing angle and the effect of improving the contrast.

The self-luminous image display device according to the embodiment of the present invention is a device in which the surface of the self-luminous image display panel is covered with a continuous transparent layer, and it is preferable that the self-luminous image display device includes the black structure on the surface of the light transmitting layer on the viewing side. Further, it is preferable that the light transmitting portion of the black structure is filled with a transparent material, and it is more preferable that the transparent layer and the light transmitting portion filled with the transparent material are integrally formed with each other.

Image Display Panel

The image display panel used in the self-luminous image display device according to the embodiment of the present invention is an optional self-luminous display panel, and specific examples thereof include an organic electroluminescence (OLED) panel, a light emitting diode (LED) array panel, and a field emission display. In particular, a micro LED array panel in which fine LED chips are densely arranged on a display substrate has a small-sized light emitting element and pixels with high brightness. Further, in principle, a reflection structure for improving the efficiency of extracting light is not required. Therefore, the micro LED array panel is preferably used from the viewpoint that image display can be made with an excellent contrast ratio even under external light.

In the black structure according to the embodiment of the present invention, the reflectivity may change depending on the wavelength as described above, and the tint during black display may change. In a case where a difference ΔR between the maximum value and the minimum value of the reflectivity in a wavelength range of 380 nm to 780 nm in the black structure according to the embodiment of the present invention is in the above-described range, the tint of reflection can be reduced. More specifically, in $L^*$, $a^*$, and $b^*$ values of the CIE1976 $L^*a^*b^*$ color space in the panel reflection during black display, the $a^*$ value is preferably in a range of −0.5 to +2.0 and the $b^*$ value is preferably in a range of −0.3 to +0.5; the $a^*$ value is more preferably in a range of −0.3 to +1.0 and the $b^*$ value is more preferably in a range of −0.2 to +0.3; and the $a^*$ value is particularly preferably in a range of ±0.0 to +0.5 and the $b^*$ value is particularly preferably in a range of −0.1 to +0.1. The tint evaluation during black display on the panel can be measured using, for example, a chromaticity characteristic measuring device Ezcontrast (manufactured by ELDIM).

EXAMPLES

Hereinafter, the effect of a self-luminous display device comprising a black structure according to the embodiment of the present invention will be described based on examples of the black layer and simulations for simulating the self-luminous image display device.

Production Example 1: Formation of Black Layer Having Fine Uneven Structure α on Surface In order to measure surface reflection characteristics of the black layer, a sample including only the black layer without a light transmitting layer was prepared. The preparation was carried out in the following manner.

(Formation of Black Layer)

As a black pigment dispersion, a composition formed of 13.1% by mass of carbon black (Special Black 250, manufactured by Degussa Co., Ltd.), 0.65% by mass of the following dispersant 1, 6.72% by mass of a polymer (random copolymer of benzyl methacrylate and methacrylic acid at molar ratio of 72/28, molecular weight of 37000), and the remainder of propylene glycol monomethyl ether acetate was prepared, and a black pigment dispersion uniformly dispersed by a paint shaker was prepared.

Dispersant 1

[chemical structure]

Next, the following composition was prepared as a composition for forming a black layer.

—Composition for Forming Black Layer—

Black pigment dispersion shown above: 25.0 parts by mass

Binder solution shown below: 9.1 parts by mass

Dipentaerythritol hexaacrylate: 4.2 parts by mass

Polymerization initiator T shown below: 0.16 parts by mass

Surfactant solution shown below: 0.044 parts by mass

Propylene glycol monomethyl ether acetate: 8.0 parts by mass

Methyl ethyl ketone: 53.0 parts by mass

Hydroquinone monomethyl ether: 0.002 parts by mass (Binder Solution)

A uniform solution of 27% by mass of an alkali-soluble polymer (a random copolymer of benzyl methacrylate/methacrylic acid at a molar ratio of 78/22, a molecular weight of 38000) and 73% by mass of propylene glycol monomethyl ether acetate.

(Surfactant Solution)

A solution containing 30% by mass of the following structure 1 and 70% by mass of methyl ethyl ketone (MEK)

(Polymerization Initiator T)

2,4-bis(trichloromethyl)-6[4-(N,N-diethoxycarbonyl-methyl)-3-bromophenyl]-s-triazine Structure 1

$-(CH_2-CH)_{40}-$          $-(CH_2-CH)_x-$
       |                            |
      O=C                          O=C
       |                            |
   $OCH_2CH_2C_nF_{2n+1}$         $O(PO)_7H$ $-(CH_2-CH)_y-$
                |
               O=C
                |
            $O(EO)_7H$ (n = 6, x = 55, y = 5, Mw = 33940, Mw/Mn = 2.55
PO: propylene oxide, EO: ethylene oxide)

A washed glass substrate was spin-coated with the above-described composition for forming a black layer, dried at 100° C. for 1 minute to remove the solvent, solid-exposed at 80 mJ/cm$^2$ using an LED lamp (a wavelength of 405 nm) in a nitrogen atmosphere, and baked at 120° C. for 3 minutes, thereby forming a black layer 1 (without a light transmitting layer, a thickness of 2.4 μm) provided on the glass plate.

(Preparation of Composition for Forming Layer (a))

Each component was put in a mixing tank so as to have the following composition, and the mixture was stirred for 60 minutes and dispersed by an ultrasonic disperser for 30 minutes to obtain a coating liquid.

Composition (A-1)

U-15HA: 1.4 parts by mass
Compound C3 shown below: 1.5 parts by mass
A-TMPT: 1.7 parts by mass
KBM-4803: 4.1 parts by mass
IRGACURE 127: 0.2 parts by mass
Compound P shown below: 0.1 parts by mass
Compound FP-2: 0.1 parts by mass
Silica particle dispersion liquid PA-1: 32.3 parts by mass
Ethanol: 12.7 parts by mass
Methyl ethyl ketone: 33.2 parts by mass
Acetone: 12.7 parts by mass U-15HA, the compound C3, A-TMPT, and KBM-4803 are curable compounds (a1), and baked silica particles are particles (a).

Each of the used compounds is described below.

U-15HA (manufactured by Shin-Nakamura Chemical Co., Ltd.): urethane acrylate

A-TMPT: polyfunctional acrylate (manufactured by Shin-Nakamura Chemical Co., Ltd.)

KBM-4803: Silane coupling agent having reactive group other than radical reactive group (manufactured by Shin-Etsu Chemical Co., Ltd.)

IRGACURE 127: Photopolymerization initiator (manufactured by BASF SE)

Compound P: Photoacid generator represented by the following structural formula (manufactured by Wako Pure Chemical Industries, Ltd.)

Silica dispersion liquid PA-1: MEK dispersion liquid (concentration of solid contents: 20% by mass) of baked silica particles (liquid phase synthesis method, average primary particle diameter: 170 nm, dispersity of particle diameter (CV value): 3.3%, particles obtained by being baked, crushed, and subjected to surface silane coupling agent treatment)

Compound P

FP-2

Mw = 30000

(Step (1): Application of Layer (a))

A 100 μm polyethylene terephthalate film (FD100M, manufactured by Fujifilm Corporation) as a temporary support was coated with 2.8 ml/m² of the composition (A-1) using a die coater and dried at 30° C. for 90 seconds. In this manner, the layer (a) was applied.

(Step (2): Pre-Exposure of Layer (a))

While purging with nitrogen so as to prepare an atmosphere of an oxygen concentration of 1.4% by volume, a part of the curable compound (a1) was cured by being irradiated with light at an irradiation dose of 5.0 mJ/cm² and an illuminance of 0.60 mW from a side of the layer (a) using a high-pressure mercury lamp (Model: 33351N, component number: LAMP-HOZ 200 D24 U 450 E, manufactured by Dr. Homle AG) to obtain a layer (ca). Further, the irradiation dose was measured by attaching HEAD SENSER PD-365 to an eye UV integral illuminometer UV METER UVPF-A1 (manufactured by Eye Graphics Co., Ltd.) in a measurement range of 0.00.

(Step (3): Attachment of Pressure Sensitive Adhesive Film)

Next, a pressure sensitive adhesive film obtained by peeling a release film off from a protective film (MASTACK TFB AS3-304, manufactured by Fujimori Kogyo Co., Ltd.) was attached onto the layer (ca) such that the pressure sensitive adhesive layer (layer (b)) was on a side of the layer (ca). These were attached at a speed 1 using a commercial laminator Bio330 (manufactured by DAE-EL Co., Ltd.).

Further, the protective film here indicates a laminate formed of a support, a pressure sensitive adhesive layer, and a release film, and a laminate formed of the support and the pressure sensitive adhesive layer which was obtained by peeling the release film off from the protective film is a pressure sensitive adhesive film.

The used protective film is described below.

MASTACK TFB AS3-304 (optical protection film with antistatic function, manufactured by Fujimori Kogyo Co., Ltd.) (hereinafter, also referred to as "AS3-304")

Support: polyester film (thickness of 38 μm)

Thickness of pressure sensitive adhesive layer: 20 μm

Maximum transmittance at wavelength of 250 nm to 300 nm in state where release film was peeled off: less than 0.1%

The transmittance was measured using a UV visible near infrared spectrophotometer UV3150 (manufactured by Shimadzu Corporation).

(Step (4): Permeation of the Curable Compound (a1) into Layer (b))

After the attachment to the pressure sensitive adhesive film, the film was allowed to stand in an environment of 25° C. for 5 minutes, and the curable compound (a1) was allowed to permeate into the layer (b).

(Step (4-2): Partial Curing of Layer (ca))

Next, while purging with nitrogen so as to prepare an atmosphere of an oxygen concentration of 0.01% by volume or less, a part of the layer (ca) was cured by being irradiated with ultraviolet rays at an illuminance of 150 mW/cm² and an irradiation close of 600 mJ/cm² from a side of the support opposite to the side of the layer (ca) using an air-cooled metal halide lamp of 160 W/cm (manufactured by Eye Graphics Co., Ltd.).

(Step (5): Peeling of Temporary Support to Produce Laminate)

FD100M serving as a temporary support was peeled off from the laminate at a speed of 30 m/min in a direction in which the peel angle was set to 180°. In this manner, the laminate 1 was obtained.

(Step (6): Attachment of Black Layer and Laminate to Each Other)

The surface of the black layer 1 and the side of the layer (ca) of the laminate 1 from which the temporary support was removed in step (5) were attached to each other. Thereafter, the attached laminate was heated at 140° C. for 2 minutes.

(Step (7): Partial Curing of Layer (ca))

Next, while purging with nitrogen so as to prepare an atmosphere of an oxygen concentration of 0.01% by volume or less, a part of the layer (ca) was cured by being irradiated with ultraviolet rays at an illuminance of 150 mW/cm² and an irradiation dose of 600 mJ/cm² from the side of the layer (ca) of the support using an air-cooled metal halide lamp of 160 W/cm (manufactured by Eye Graphics Co., Ltd.).

(Step (8): Peeling of Pressure Sensitive Adhesive Film)

The pressure sensitive adhesive film (MASTACK TFB AS3-304 from which the release film was peeled oft) was peeled off from the produced laminate.

(Step (9): Curing of Layer (ca))

Next, while purging with nitrogen so as to prepare an atmosphere of an oxygen concentration of 0.01% by volume or less, the layer (ca) was cured by being irradiated with ultraviolet rays at an illuminance of 150 mW/cm² and an irradiation dose of 600 mJ/cm² from a side of the layer (ca) opposite to a base film using an air-cooled metal halide lamp of 160 W/cm (manufactured by Eye Graphics Co., Ltd.).

(Step (10): Washing)

Next, methyl isobutyl ketone was poured over the surface to which the pressure sensitive adhesive film was attached to wash off the residues of the pressure sensitive adhesive layer. Thereafter, the layer was dried at 25° C. for 10 minutes and further post-baked at 180° C. for 30 minutes to obtain a black layer 1b (thickness of 2.5 µm) having a surface provided with a fine uneven structure α (fine uneven period: 190 nm). The fine uneven period was measured by the following method.

(Measuring Method)

The fine structure period was acquired by randomly drawing a straight line from an end to an end on a scanning electron micrograph, measuring distances (n=50) between the vertices of adjacent projections on the straight line, calculating the average value, and rounding off the first digit (less than 10 nm).

Production Example 2: Formation of Black Layer Having Surface without Fine Uneven Structure In the above-described step, while purging with nitrogen so as to prepare an atmosphere of an oxygen concentration of 0.01% by volume or less without transferring the fine uneven structure to the surface of the black layer 1, the black layer 1 was cured by being irradiated with ultraviolet rays at an illuminance of 150 MW/cm$^2$ and an irradiation dose of 600 mJ/cm$^2$ using an air-cooled metal halide lamp of 160 W/cm (manufactured by Eye Graphics Co., Ltd.) and further post-baked at 180° C. for 30 minutes, and thus a black layer 2 (not including a light transmitting portion) having a surface without a fine uneven structure was formed on the glass substrate.

Production Example 3: Formation of Black Layer 3 Having Fine Uneven Structure β on Surface Thereof A 100 µm polyethylene terephthalate film (FD100M, manufactured by Fujifilm Corporation) serving as a support was subjected to a corona treatment and coated with a UV curable resin (product name "SK1100", manufactured by Dexerials Corporation) using a bar coater. Subsequently, while the coating layer of the UV curable resin was wound around a shape transfer roll having a fine uneven pattern in which the fine uneven pitch was 230 nm on average and the depth of the recess was approximately 250 nm, the coating layer was irradiated with UV light from the side of the support, thereby obtaining a cured layer. Further, a sputtered layer of tungsten oxide (thickness of 25 nm) was provided on the cured layer to form a release layer. This release layer was used as a mold film 1.

An inorganic layer of the obtained mold film 1 was coated with a UV curable resin (product name "SK1100", manufactured by Dexerials Corporation) using a die coater so that the thickness thereof was set to 2 µm (the portion with the maximum thickness). While the side of the coating layer was wound around a release roll having a smooth surface, the coating layer was exposed at an irradiation dose of 10 kJ/cm$^2$ from the side of the support, and a resin layer having a fine uneven structure β (fine uneven period: 230 nm) was formed on the inorganic layer of the mold film 1.

A cyanoacrylate-based adhesive was applied on the obtained resin layer, laminated on the black layer 1 formed in Production Example 1 and allowed to stand for 10 minutes to cure the adhesive, the mold film 1 was peeled off, and a black layer 3 (thickness: 4.5 µm) having a fine uneven structure β on the surface thereof was obtained.

(Evaluation of Reflection Characteristics)

Figure 7:
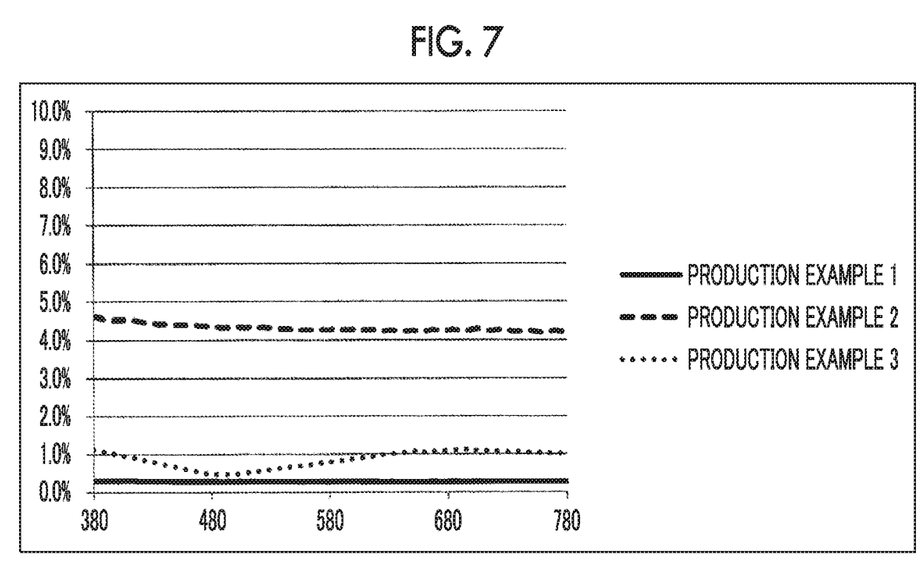
FIG. 7 shows reflection spectra of black layers created in Production Example 1 and Production Example 2 in the present specification.

With the black layer 1b having the fine uneven structure α on the surface thereof (Production Example 1), the black layer 2b cured without transferring the fine uneven structure to the surface thereof (Production Example 2), and the black layer 3 having the fine uneven structure β on the surface thereof (Production Example 3), the specular reflectivity of an emission angle of −5° at an incidence angle of 5° in a wavelength range of 380 to 780 nm was measured by mounting an adapter "ARV-474" on a spectrophotometer "V-5502" [manufactured by JASCO Corporation]. The average reflectivity in a wavelength range of 450 to 650 nm and the tint, that is, the L*, a*, and b* values in the CIE1976 L*a*b* color space were acquired from the obtained reflection spectra (FIG. 7).

(Formation of Black Structure)

A black structure including a black layer having a fine uneven structure on the surface thereof and a light transmitting portion formed of voids at an area ratio of 90:10 was able to be produced on a glass substrate in the same manner as in Production Example 1 except that the coated film of the composition for forming a black layer was subjected to patterning exposure in a lattice form at the same exposure amount, developed with an alkali to remove an unexposed portion, and baked in place of the step of solid-exposing the coated film at an exposure amount of 80 mJ/cm$^7$ in the above-described step. In a case where the black structure was placed on black paper and observed in a bright room, it was confirmed that the black structure had satisfactory jet blackness.

(Implementation Simulation 1 of Self-Luminous Image Display Device)

The surface reflection behavior of an image display panel was simulated, assuming that the image display panel was an image display panel in which a light emitting element package (pixel) was provided on a substrate and sealed with a transparent resin layer with a refractive index of 1.48.

The black structure was buried in the transparent resin layer so that the light transmitting portion was filled with the transparent resin layer, and the black structure was flush with the air interface of the light transmitting portion on the viewing side. It was assumed that all light that was incident on the transparent resin layer and was reflected on the surface of the transparent resin layer opposite to the surface on which the black structure was provided was only specular-reflected and the reflectivity in the entire wavelength range was 4%.

Further, the data of the black layers 1b, 2b, and 3 described above was used for the reflection spectra of the black layers, respectively. As the reflection spectra in a case where the fine uneven structure α or β was provided on the transparent resin layer, the reflection spectra of the film obtained by providing the fine uneven structure α or β on a polymethylmethacrylate (PMMA) film was used.

Reflection spectra obtained by irradiating these black structures with light using a light source of a standard illuminant D65 described in Japanese Industrial Standard (JIS) Z 8720 from a side of an observer were obtained by simulation, and the obtained spectra were converted into the L* value, the a* value, and the b* value by a program. The results are listed in Table 1. The area ratios of the black layer to the light transmitting portion (black layer/light transmitting portion) were set to 50/50, 75/25, 90/10, and 95/5. Further, the effects of diffraction and reflection occurring at the boundary between the black layer and the light transmitting portion were ignored.

Comparative Example 1 is an example in which the black layer 2b without a fine structure was used.

Examples 1 to 8 are examples in which the black layer 1b having the fine structure α was used.

Examples 9 to 16 are examples in which the black layer 3 having the fine structure β was used.

TABLE 1

| Fine structure | | | Area ratio of black layer to light | Black structure | Reflection characteristics | | | | |
|---|---|---|---|---|---|---|---|---|---|
| | Black layer | Light transmitting portion | transmitting portion | ΔR | Average reflectivity | L* | a* | b* | |
| — | Not provided | Not provided | 50/50 | 0.1% | 6.2% | 29.84 | 0.13 | −0.09 | Comparative Example 1 |
| Fine structure α | Provided | Not provided | 50/50 | 0.03% | 4.1% | 24.00 | 0.01 | −0.01 | Example 1 |
| | Provided | Not provided | 75/25 | 0.03% | 2.2% | 16.56 | 0.03 | −0.02 | Example 2 |
| | Provided | Not provided | 90/10 | 0.03% | 1.1% | 9.43 | 0.05 | −0.03 | Example 3 |
| | Provided | Not provided | 95/5 | 0.03% | 0.7% | 6.03 | 0.06 | −0.04 | Example 4 |
| | Provided | Provided | 50/50 | 0.03% | 2.6% | 18.54 | 0.02 | −0.01 | Example 5 |
| | Provided | Provided | 75/25 | 0.03% | 1.5% | 12.36 | 0.03 | −0.02 | Example 6 |
| | Provided | Provided | 90/10 | 0.03% | 0.8% | 6.81 | 0.06 | −0.04 | Example 7 |
| | Provided | Provided | 95/5 | 0.03% | 0.5% | 4.68 | 0.06 | −0.04 | Example 8 |
| Fine structure β | Provided | Not provided | 50/50 | 0.3% | 4.4% | 24.8 | 0.71 | 0.16 | Example 9 |
| | Provided | Not provided | 75/25 | 0.5% | 2.7% | 18.09 | 1.52 | 0.35 | Example 10 |
| | Provided | Not provided | 90/10 | 0.6% | 1.6% | 12.25 | 2.63 | 0.62 | Example 11 |
| | Provided | Not provided | 95/5 | 0.6% | 1.2% | 9.64 | 3.34 | 0.80 | Example 12 |
| | Provided | Provided | 50/50 | 0.3% | 2.9% | 19.47 | 0.94 | 0.22 | Example 13 |
| | Provided | Provided | 75/25 | 0.5% | 1.9% | 14.33 | 1.91 | 0.45 | Example 14 |
| | Provided | Provided | 90/10 | 0.6% | 1.3% | 10.14 | 3.05 | 0.73 | Example 15 |
| | Provided | Provided | 95/5 | 0.6% | 1.1% | 8.40 | 3.67 | 0.89 | Example 16 |

Based on the comparison with a case where the black structure having a surface without a fine uneven structure and simply formed of the black layer and the light transmitting portion was disposed (Comparative Example 1), it was found that the L* value was 25.0 or less in a case of the black structure in which the fine uneven structure was provided on the surface of the black layer and the surface reflectivity was reduced (Examples 1 to 16), and the L* value was 24.0 or less which was a standard for the jet blackness and satisfactory jet blackness was able to be imparted particularly in a case of the fine structure α.

Further, based on the comparison with the results obtained by changing the area ratios between the black layer region and the light transmitting portion region in the black structure, it was found that more satisfactory jet blackness was exhibited as the ratio of the light transmitting portion region was decreased. It can be expected that the effects of the present invention are remarkably exhibited in a case of combining the black structure with an image display panel having a relatively small light transmitting portion due to a small size of the light emitting element and pixels with high brightness.

Further, in a case where the fine uneven structure is provided not only on the black layer but also on the surface of the light transmitting portion on the viewing side in the black structure (Examples 5 to 8 and Examples 13 to 16), it was found that the reflectivity of the entire black structure is decreased due to the reduction of the reflection components on the surface of the light transmitting portion on the viewing side and the jet blackness for visual recognition of the observer is further enhanced (the L* value is decreased).

In a case where the fine uneven structure is a moth-eye structure formed of fine particles having an average primary particle diameter of 100 to 250 nm which is buried in the binder resin layer as in Examples 1 to 8, since a change in the reflectivity in the visible light range is small and the reflection tint is closer to more neutral black, the jet blackness for visual recognition of the observer is further enhanced (the a* value and the b* value are closer to ±0).

Implementation Simulation 2 of Self-Luminous Image Display Device

GALAXY S IV (manufactured by SAMSUNG) equipped with an organic EL panel was disassembled, a circularly polarizing plate was peeled off therefrom, and the average specular reflection spectrum (including the specular reflection) of the obtained organic EL display panel was measured. The simulation for the surface reflection behavior of the substrate was performed in the same manner as in the implementation simulation 1, assuming the reflection spectrum data as the reflection spectrum of the substrate. The results are listed in Table 2.

TABLE 2

| Fine structure | | | Area ratio of black layer to light transmitting portion | Black structure ΔR | Reflection characteristics | | | | |
|---|---|---|---|---|---|---|---|---|---|
| | Black layer | Light transmitting portion | | | Average reflectivity | L* | a* | b* | |
| — | Not provided | Not provided | 50/50 | 0.1% | 21.9% | 53.75 | −1.28 | −8.82 | Comparative Example 2 |
| Fine structure α | Provided | Not provided | 50/50 | 0.03% | 19.8% | 51.53 | −1.37 | −9.26 | Example 17 |
| | Provided | Not provided | 75/25 | 0.03% | 10.1% | 37.85 | −1.08 | −7.30 | Example 18 |
| | Provided | Provided | 50/50 | 0.03% | 18.3% | 49.77 | −1.45 | −9.71 | Example 19 |
| | Provided | Provided | 75/25 | 0.03% | 9.3% | 36.47 | −1.13 | −7.65 | Example 20 |

These simulation results briefly show the effects in a case where the black structure according to the embodiment of the present invention is incorporated in a self-luminous image display device. Practically, for example, the light emitting element or wiring, the substrate on which these are provided, the reflectivity of the transparent resin layer, and the influence of scattering on each member should be considered, but those skilled in the art will be able to fully understand that the black structure according to the embodiment of the present invention is particularly useful for decreasing the display contrast due to external light incident from the viewing side of the image display device.

EXPLANATION OF REFERENCES

1: black structure
2: black layer
3: fine uneven structure
4: base material
5: light incident from viewing side
6: light reflected on surface of black layer
7: light transmitting portion
8: light emitted from light source
9: transparent resin layer (sealing layer)
10: self-luminous image display panel
11: temporary support for formation
12: coated film of composition for forming black layer
31: layer (a)
32: particle (a2)
33: temporary support
34: layer (b)
35: support
36: pressure sensitive adhesive film
37: laminate
UV: ultraviolet ray

What is claimed is:

1. A black structure comprising, in a same plane:
a black layer which absorbs light beams from a viewing side; and
a light transmitting portion which transmits light incident from a side opposite to the viewing side,
wherein the black layer has a fine uneven structure having a period of 380 nm or less on a surface of the black layer on the viewing side,
wherein a surface of the black layer opposite to the surface having the fine uneven structure is bonded to a base material,
wherein the light transmitting portion is filled with a transparent material,
wherein the surface of the black layer on the viewing side and a surface of the light transmitting portion on the viewing side which is filled with the transparent material are provided on the same plane, and
wherein a fine uneven structure which is the same as the fine uneven structure provided on the black layer and having a period of 380 nm or less is also provided on the surface of the light transmitting portion on the viewing side.

2. The black structure according to claim 1,
wherein the fine uneven structure is constituted of a moth-eye structure consisting of fine particles having an average primary particle diameter of 100 to 250 nm which are buried in a binder resin layer.

3. A self-luminous image display device comprising:
a self-luminous image display panel; and
a black structure which includes a black layer and a light transmitting portion in a same plane,
wherein the black layer has a fine uneven structure provided on a surface of the black layer on a viewing side and a surface of the black layer opposite to the surface having the fine uneven structure faces an image display panel,
wherein the light transmitting portion is provided above a light emitting element of the self-luminous image display panel,
wherein a surface of the self-luminous image display panel is covered with a continuous transparent layer,
wherein the black structure is provided on a surface of the transparent layer on the viewing side,
wherein the light transmitting portion of the black structure is filled with a transparent material,
wherein the transparent layer and the light transmitting portion filled with the transparent material are integrally formed with each other,
wherein the surface of the black layer on the viewing side and a surface of the light transmitting portion on the viewing side are provided on the same plane, and
wherein a fine uneven structure which is the same as the fine uneven structure provided on the black layer and having a period of 380 nm or less is also provided on the surface of the light transmitting portion on the viewing side.

4. The self-luminous image display device according to claim 3,
wherein the fine uneven structure is constituted of a moth-eye structure consisting of fine particles having an average primary particle diameter of 100 to 250 nm which are buried in a binder resin layer.

5. The self-luminous image display device according to claim 3,
wherein the self-luminous image display panel is an LED array panel.

\* \* \* \* \*